United States Patent [19]
Kishida et al.

[11] Patent Number: 6,046,637
[45] Date of Patent: Apr. 4, 2000

[54] FEEDFORWARD AMPLIFIER

[75] Inventors: Hiroshi Kishida; Ken Takei, both of Hachiouji; Hiroshi Okabe, Kokubunji; Kenji Sekine, Nishitama-gun; Kazuyuki Hori, Ebina, all of Japan

[73] Assignee: Hitachi, Ltd., Tokyo, Japan

[21] Appl. No.: 09/132,237

[22] Filed: Aug. 11, 1998

[30] Foreign Application Priority Data

Aug. 11, 1997 [JP] Japan ................................ 9-216877

[51] Int. Cl.⁷ ........................................ H03F 1/32
[52] U.S. Cl. .................................... 330/151; 330/52
[58] Field of Search ........................ 330/52, 151, 149

[56] References Cited

U.S. PATENT DOCUMENTS 5,386,198  1/1995  Ripstrand et al. .................... 330/52
5,445,537  8/1995  Larkin et al. ........................ 330/52

FOREIGN PATENT DOCUMENTS 1-198809  8/1989  Japan .

*Primary Examiner*—Robert Pascal
*Assistant Examiner*—Khanh Van Nguyen
*Attorney, Agent, or Firm*—Antonelli, Terry, Stout & Kraus, LLP

[57] ABSTRACT

An improved feedforward amplifier capable of enhancing accuracy of extraction of an error signal corresponding to a distortion component while preventing outflow of an pilot signal. A switch is disposed between a pilot signal oscillator and a third power combiner for superimposing the pilot signal on an output signal from a main amplifier, and third control means is connected with the switch so that the switch is opened at the time of error signal extraction and closed at the time of error signal elimination.

22 Claims, 5 Drawing Sheets

FEEDFORWARD AMPLIFIER

BACKGROUND OF THE INVENTION

The present invention relates to a feedforward amplifier using two kinds of signal cancel loops for reducing distortion, and more particularly to an improved feedforward amplifier suitable for high-frequency power amplification in radio communication equipment.

In general, a conventional feedforward amplifier is provided with two kinds of signal cancel loops; an error signal extraction loop for extracting a distortion (error) signal by subtracting a main signal component from an amplifier output signal, and an error signal elimination loop for attaining only the main signal component in output by subtracting the thus extracted error signal from the amplifier output signal. In Japanese Patent Laid-open (Kokai) No. Hei 1-198809, there is disclosed a feedforward amplifier arranged for reducing distortion accurately using a pilot signal on a signal cancel loop.

Referring now to FIG. 5, there is shown a general circuit configuration of a feedforward amplifier using a pilot signal. The following explains an error signal extraction loop thereof.

An input signal to a first power divider 11 is branched to a first path 33 and a second path 34. On the first path 33, the input signal is then amplified to a predetermined power level by a main amplifier 13. At this step of operation, distortion occurs due to non-linearity of active elements used in the main amplifier 13, causing intrusion of a distortion signal, i.e., an error signal into an output signal thereof. In addition, a pilot signal generated by a pilot signal oscillator 12 is superimposed on the output signal of the main amplifier 13 through a third power combiner 22. Consequently, a part of the error signal is also caused by the pilot signal. Therefore, an output signal delivered from the third power combiner 22 contains the main signal component corresponding to the input signal fed to the main amplifier 13 and the error signal component. The output signal from the third power combiner 22 is then branched to a third path 35 and a fourth path 36 by a second power divider 14. On the third path 35, the output signal thus branched is applied to one of input terminals of a first power combiner 25.

On the other hand, the input signal branched to the second path 34 by the power divider 11 is applied to the other input terminal of the first power combiner 25 through a first vector adjustor 23. At the first power combiner 25, the two signals applied thereto are added. As shown in FIG. 6, the first vector adjustor 23 comprises a variable attenuator 31 and a variable phase shifter 32.

In the above sequence of operation, a power distribution ratio of the first power divider 11, a power distribution ratio of the second power divider 14, and an attenuation level of the first vector adjustor 23 are set up so that an equal amplitude component will be provided for main signal components of the two signals applied to the first power combiner 25. Further, a phase shift level of the first vector adjustor 23 is set up so that a mutually reversed phase will be provided for the main signal components of the two signals applied to the first power combiner 25. Thus, when conditions of equal amplitude and phase reversal are satisfied, the main signal components are canceled mutually to let the first power combiner 25 output an error signal component only.

At this step of operation, if the conditions of equal amplitude and phase reversal are not satisfied due to variation in temperature or deterioration with age in the main amplifier 13, the error signal component delivered from the first power combiner 25 is mixed with a part of the main signal components, thereby increasing a total power level of output from the first power combiner 25. Hence, to ensure accurate extraction of the error signal component, first level observation means 20 detects an output signal level of an error amplifier 26, and first control means 21 adjusts an attenuation level and phase shift level of the first vector adjustor 23 so that the output signal level of the error amplifier 26 will be minimized.

For automatic operation of the above adjustment, the first level observation means 20 comprises a diode detector and a ripple filter, and the first control means 21 comprises a microprocessor and an AD/DA converter, for example. In such an arrangement, the first level observation means 20 converts a power level of output from the first power combiner 25 into a DC voltage, and according to the DC voltage, the first control means 21 controls the first vector adjustor 23. For this control, such an algorithm as a perturbation method is employed.

Then, the following explains an error signal elimination loop of the feedforward amplifier using a pilot signal.

The error signal component output from the first power combiner 25 is amplified by the error amplifier 26, and it is then applied to one of the input terminals of a second power combiner 16 through a second vector adjustor 19 which is structured similarly to the first vector adjustor 23.

On the other hand, the output signal branched to the fourth path 36 by the second power divider 14 is applied to the other terminal of the second power combiner 16. At the second power combiner 16, the two signals applied thereto are added.

In the above sequence of operation, an amplification factor of the error amplifier 26 and an attenuation level of the second vector adjustor 19 are set up so that an equal amplitude component will be provided for error signal components of the two signals applied to the second power combiner 16. Further, a phase shift level of the second vector adjustor 19 is set up so that a mutually reversed phase will be provided for the error signal components. Thus, when conditions of equal amplitude and phase reversal are satisfied, the error signal components are canceled mutually to let the second power combiner 16 output a distortion-free accurate signal (main signal component).

At this step of operation, if the conditions of equal amplitude and phase reversal are not satisfied due to variation in temperature or deterioration with age in the error amplifier 26, removal of the error signal components becomes insufficient, resulting in undesired error signal components (distortion component and pilot signal component) remaining in the main signal component output from the second power combiner 16. Hence, to ensure accurate removal of the error signal components, second level observation means 17 detects a remnant pilot signal level in output from the second power combiner 16, and second control means 17 adjusts an attenuation level and phase shift level of the second vector adjustor 19 so that the remnant pilot signal level will be minimized.

As shown in FIG. 7, for example, the second level observation means 17 comprises a synchronous demodulation circuit including a mixer 41, a low-pass filter 42 and a DC amplifier 43. In such an arrangement, the second level observation means 17 outputs a DC voltage corresponding to amplitude of the pilot signal, and the second control means 18 controls the second vector adjustor 19 according to the DC voltage. Since the pilot signal causes an error signal component similar to a distortion component from the main amplifier 13, distortion is suppressed sufficiently in output from the second power combiner 16.

SUMMARY OF THE INVENTION

In the above-mentioned feedforward amplifier using a pilot signal, adjustment is optimized at a frequency of the pilot signal. Therefore, if gain flatness of the main amplifier or error amplifier is unsatisfactory, distortion is improved only at the pilot signal frequency and in its close vicinity. It is necessary to allocate the pilot signal frequency outside a frequency band of a main signal so that the main signal will be without effect by the pilot signal frequency disposition. However, if the pilot signal frequency is allocated far apart from the main signal frequency band, effectiveness of improvement in distortion decreases for the reason mentioned above. Accordingly, for the pilot signal, it is required to select a particular frequency which is outside the main signal frequency band and in its closest possible vicinity.

The feedforward amplifier using the pilot signal stated above has a disadvantage that accuracy of error signal extraction is decreased by the pilot signal. Designating a level of the main signal component observed by the first level observation means 20 as Ps2, a level of the pilot signal as Pp2, and a level of the distortion component as Pd2, Ps2 decreases gradually through error signal extraction processing while Pp2 and Pd2 remain unchanged. Hence, if Ps2 is lower than a certain level, it is buried in error components "Pp2+Pd2" to cause a decrease in detection sensitivity of Ps2.

Contrarily, in error signal elimination, as a level of the pilot signal increases, elimination sensitivity becomes higher. At the second level observation means 17 comprising the aforementioned synchronous demodulation circuit, the pilot signal component containing a substantial quantity of leaked main signal component is commonly output due to insufficiency of out-of-band attenuation by a filter element employed. Here, a leakage level of the main signal component observed by the second observation means 17 is designated as Ps1 a level of the pilot signal component as Pp1, and a level of the distortion component as Pd1. Through error signal elimination processing, Pp1 and Pd1 decrease gradually down to approx. zero while Ps1 remains unchanged. Hence, in terms of observation level before and after error signal elimination operation, "Ps1+Pp2+Pd1" is reduced toward Ps1 since only "Pp1+Pd1" is changed. Namely, if Pp1 is increased, a value of change increases relatively to the observation level, thereby enabling improvement in observation level accuracy.

As to the foregoing feedforward amplifier configuration, it has been proposed to provide a changeover switch between the pilot signal oscillator 12 and the third power combiner 22 so that the pilot signal is supplied to the first power divider 11 at the time of error signal extraction and to the third power combiner 22 at the time of error signal elimination. In this scheme, the pilot signal can be excluded from the error signal in operation of error signal extraction. However, in error signal extraction, the pilot signal is superimposed on the input signal (main signal), which causes a disadvantageous condition that the pilot signal is output from the second power combiner 16 together with the main signal. In a common application that the feedforward amplifier is used as a high-frequency power amplifier for radio communication equipment, it is stringently required to prevent outflow of any signal other than the main signal component. The proposed scheme in which the changeover switch is provided as mentioned above gives rise to a critical problem that such a stringent requirement cannot be satisfied.

It is therefore an object of the present invention to obviate the above-mentioned disadvantage of the prior art by providing an improved feedforward amplifier which is capable of enhancing accuracy of extraction of an error signal corresponding to a distortion component while preventing outflow of the pilot signal.

In accomplishing this object of the present invention and according to one aspect thereof, there is provided a novel form of feedforward amplifier circuit in which a switch is disposed between a pilot signal oscillator and a third power combiner for superimposing a pilot signal on a main amplifier output signal and third control means is connected with the switch so that the switch is opened at the time of error signal extraction and closed at the time of error signal elimination. In this circuit arrangement, since the pilot signal is not superimposed on the main amplifier output signal at the time of error signal extraction, accuracy of error signal extraction can be enhanced and also outflow of the pilot signal can be circumvented. A decrease in error signal component increases accuracy of main signal component level observation, thereby making it possible to enhance the accuracy of error signal extraction. On the other hand, at the time of error signal elimination, the pilot signal is superimposed on the main amplifier output signal to effectively remove an error while the pilot signal does not flow out.

From first control means for controlling a first vector adjustor disposed on an error extraction loop and second control means for controlling a second vector adjustor disposed on an error elimination loop, the third control means receives a flag signal indicating an active state of each of them and generates a control signal for controlling the switch accordingly.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
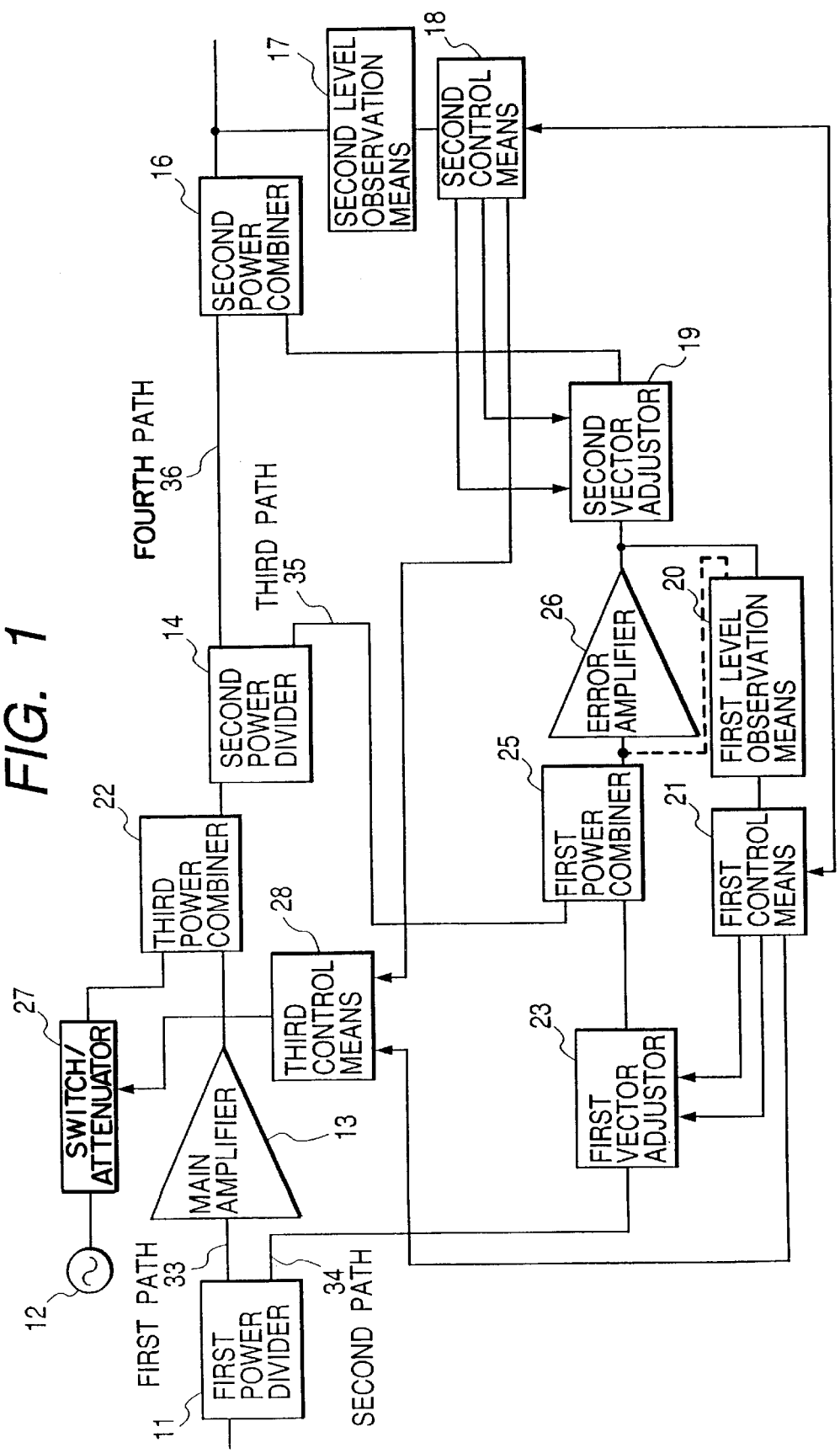
FIG. 1 is a circuit block diagram showing a preferred embodiment of a feedforward amplifier according to the present invention.

The present invention will now be described in further detail by way of example with reference to the accompanying drawings. In FIGS. 1 to 7, like reference numerals designate like or corresponding parts throughout.

Figure 2:
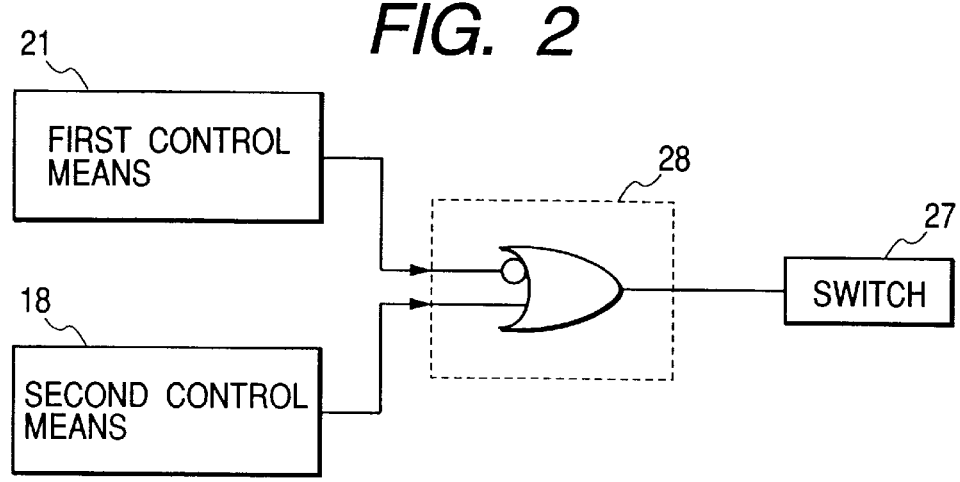
FIG. 2 is a circuit scheme of assistance in explaining switch control means in the preferred embodiment.

Referring to FIG. 1, reference numeral 27 indicates a switch/attenuator disposed between a pilot signal oscillator 12 and a third power combiner 22, and reference numeral 28 indicates a third control means connected with the switch/attenuator 27. A switch is used as the switch/attenuator 27. The third control means 28 is also connected with a first control means 21 and a second control means 18. While receiving a flag signal indicating an active state from each of the first control means 21 and the second control means 18, the third control means 28 supplies a control signal to the attenuator 27 for controlling its opening/closing operation. Referring to FIG. 2, there is shown a circuit scheme of the third control means 28. The third control means 28 arranged as shown in this circuit scheme opens the switch/attenuator 27 when the first control means 21 is active and it closes the switch/attenuator 27 when the second control means 18 is active. Further, the flag signal is also interchanged between the first control means 21 and the second control means 18, and when one of these control means is active, the other control means is deactivated.

Figure 3:
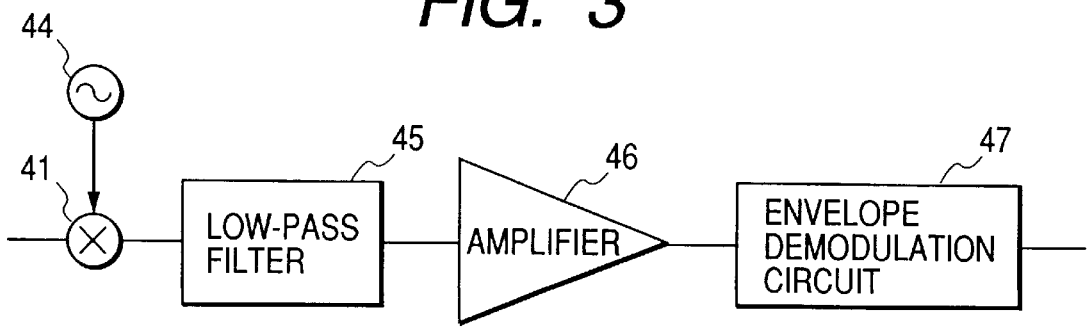
FIG. 3 is a circuit scheme of assistance in explaining pilot signal level observation means in the preferred embodiment.

Referring to FIG. 3, there is shown a circuit scheme of second level observation means 17 in the present preferred embodiment. The second level observation means 17 comprises a local oscillator 44 which generates a carrier having a frequency different from that of a pilot signal and supplies it to a mixer 41, a low-pass filter 45 for permitting passage of a difference frequency component corresponding to a difference between the pilot signal and the carrier, an amplifier circuit 46 for amplifying the difference frequency component delivered from the low-pass filter 45, and an envelope demodulator circuit 47 for detecting an envelope of the difference frequency component output from the amplifier circuit 46.

Figure 5:
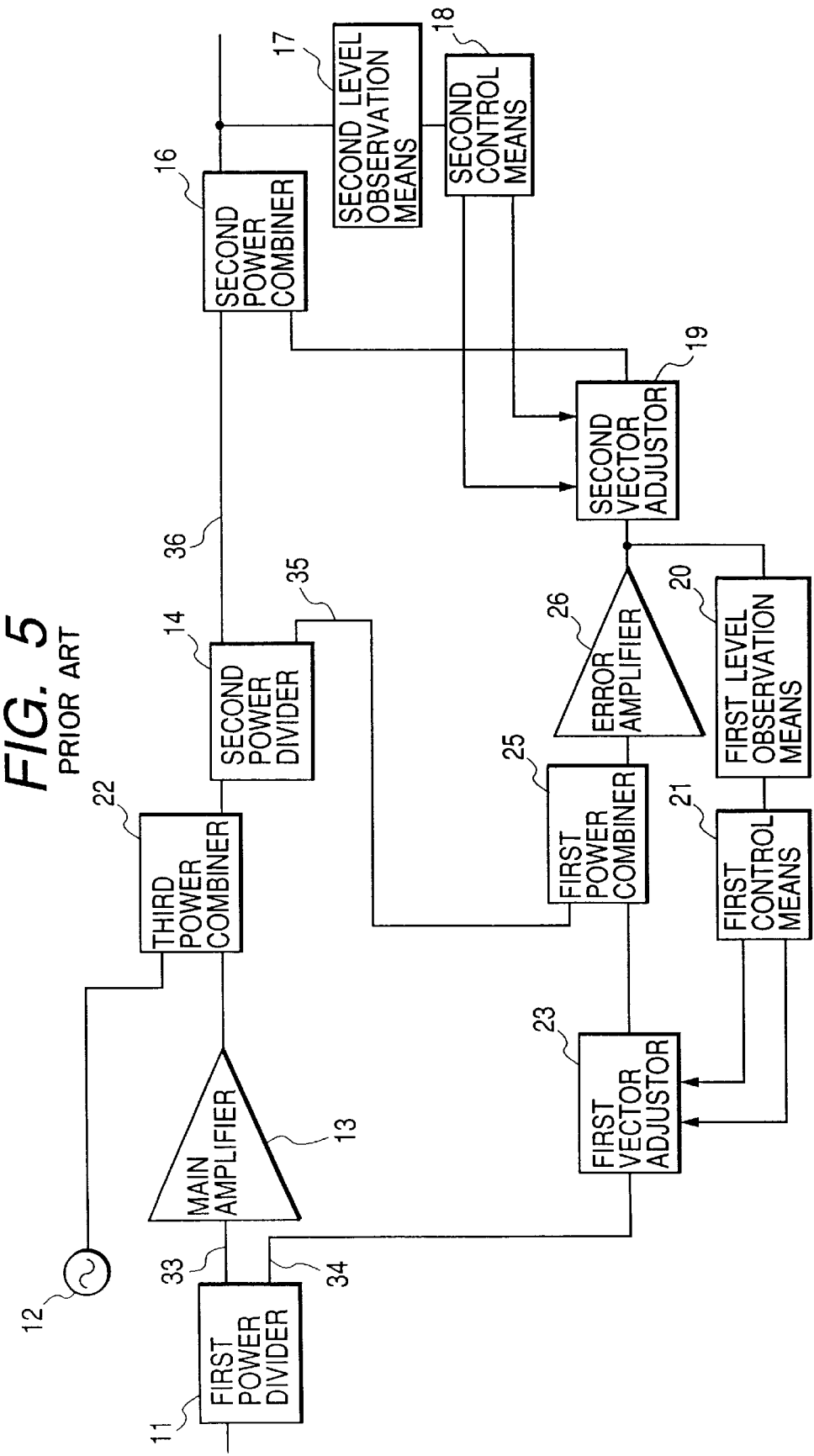
FIG. 5 is a circuit block diagram showing a conventional feedforward amplifier.
Figure 6:
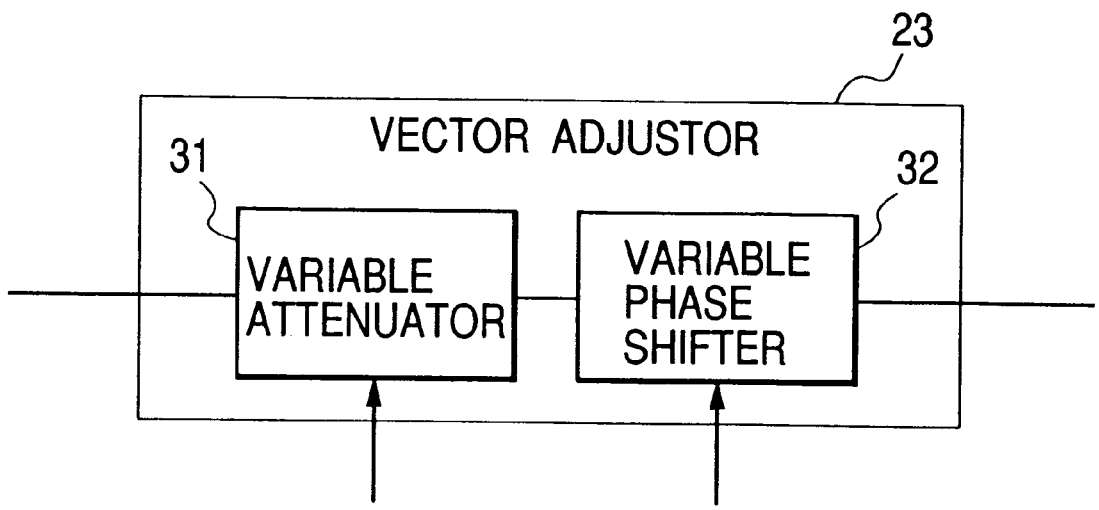
FIG. 6 is a circuit scheme of assistance in explaining a vector adjustor.
Figure 7:
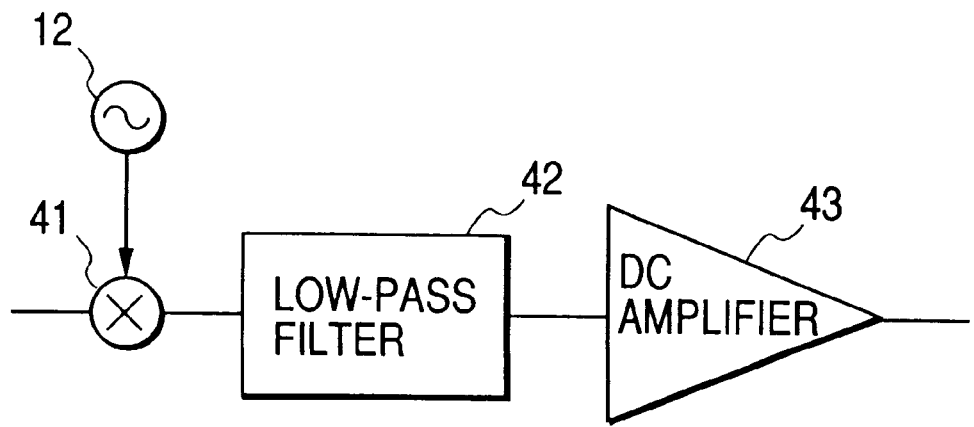
FIG. 7 is a circuit scheme of assistance in explaining pilot signal level observation means in the conventional feedforward amplifier.

Other parts in the present preferred embodiment are the same as those of the conventional feedforward amplifier shown in FIG. 5, and therefore description of these parts is not given here.

Figure 4:
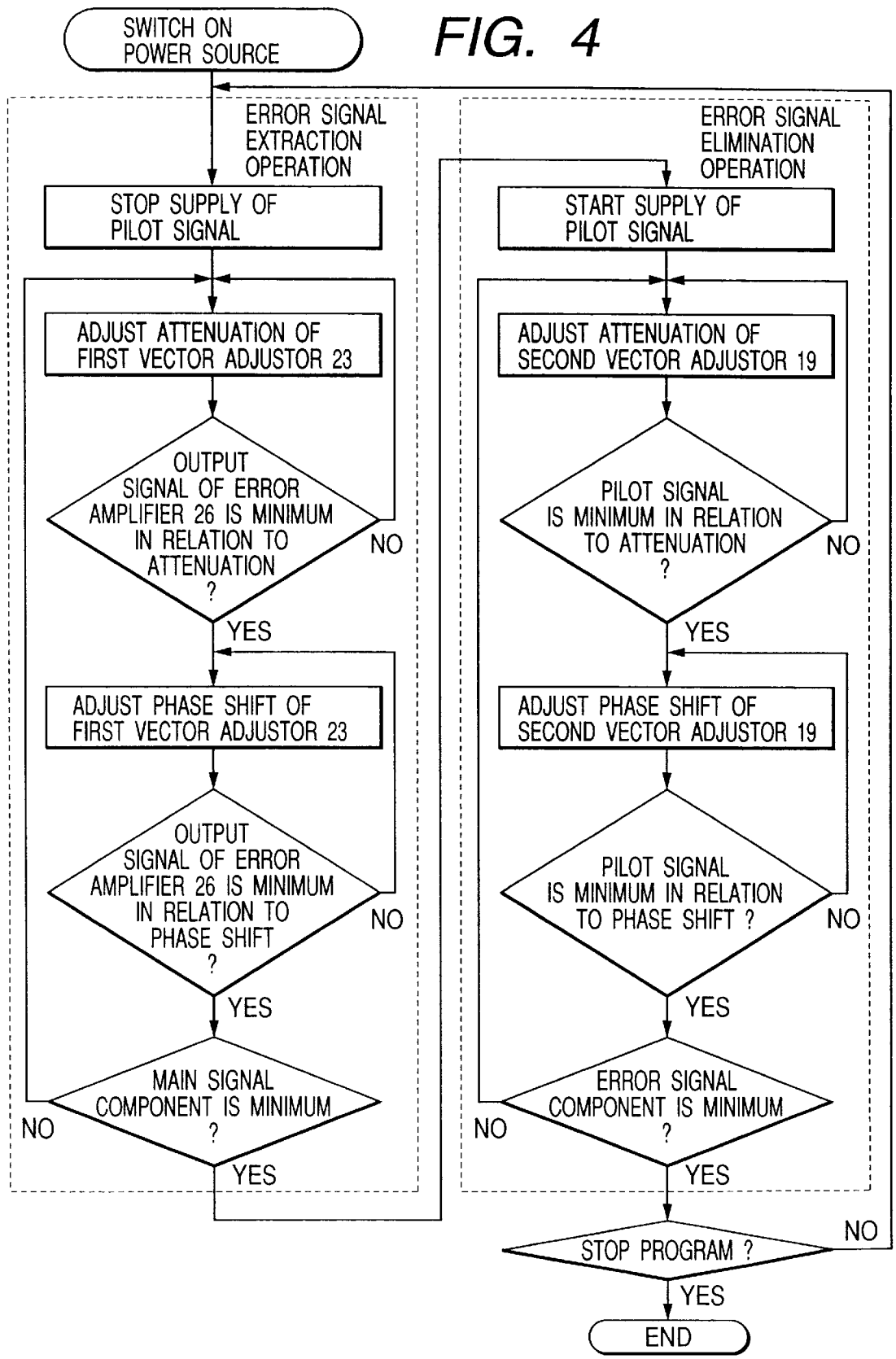
FIG. 4 is a flowchart illustrating a control process flow in the preferred embodiment.

Referring to FIG. 4, there is shown a flowchart illustrating a control process flow in the present preferred embodiment. When power source is switched on, the first control means 21 is made active to send the flag signal "1" to the third control means 28. Upon receipt of this signal, the third control means 28 sets the control signal to "0" for opening the switch/attenuator 27, thereby stopping the pilot signal to the third power combiner 22. First level observation means 20 converts a level of output from an error amplifier 26 into a DC voltage, and then the first control means 21 controls an attenuation level of a first vector adjustor 23 so that the DC voltage is minimized. The first control means 21 also controls a phase shift level of the first vector adjustor 23 so that the DC voltage is minimized. Repeating attenuation adjustment and phase shift adjustment alternately, the first control means 21 sets up attenuation and phase shift levels corresponding the lowest possible value of DC voltage. Under this condition, a main signal component is minimized. At this step of sequence, the first control means 21 is deactivated, causing the flag signal to the third control means 28 to become "0". Thus, error signal extraction operation is completed.

Note that while the first control means 21 is active, operation of the second control means 18 is stopped and the flag signal from the second control means 18 to the third control means 28 remains "0".

Subsequently, the second control means 18 becomes active and the flag signal to the third control means 28 is set to "1". Upon receipt of this signal, the third control means 28 closes the switch/attenuator 27, thereby supplying the pilot signal to the third power combiner 22. The second level observation means 17 converts a level of pilot signal output from a second power combiner 16 into a DC voltage, and then the second control means 18 controls an attenuation level of a second vector adjustor 19 so that the DC voltage is minimized. The second control means 18 also controls a phase shift level of the second vector adjustor 19 so that the DC voltage is minimized. Repeating attenuation adjustment and phase shift adjustment alternately, the second control means 18 sets up attenuation and phase shift levels corresponding to the lowest possible value of DC voltage. Under this condition, a pilot signal is minimized and simultaneously a distortion component is minimized. At this step of sequence, the second control means 18 is deactivated, stopping the flag signal to the third control means 28. Thus, error signal elimination is completed.

As mentioned above, basic circuit adjustments can be accomplished in the present preferred embodiment. However, there may be a situation that an adjustment point deviates from an optimum value due to variation in temperature or deterioration with age in any amplifier element. To prevent this, control process operations of the above-mentioned error signal extraction operation and error signal elimination operation are repeated so that an optimally adjusted state is provided at all times.

In a modified form of the control process flow shown in FIG. 4, the order of attenuation adjustment and phase shift adjustment may be reversed arbitrarily in each operation of error signal extraction and error signal elimination.

Furthermore, it is to be understood that the invention is not limited in its application to the details of circuit arrangement illustrated in the accompanying drawings and that various changes and modifications may be made in the invention as exemplified below.

(1) An input signal applied to the first level observation means 20 is replaced with an output signal of a first power combiner 25.

For this replacement, an input wiring to the first level observation means 20 is changed to a connection by the dotted line in FIG. 1 between the first power combiner 25 and the first level observation means 20 from the connection by the solid line in FIG. 1 between the error amplifier 26 and the first level observation means 20.

(2) An attenuator is used as the switch 27. In this case, an increased attenuation level of the attenuator is arranged to correspond to an open state of the switch used as the switch/attenuator 27, and a decreased attenuation level of the attenuator is arranged to correspond to a closed state of the switch used as the switch/attenuator 27.

(3) To compensate for frequency characteristics and delay characteristics of a main amplifier 13, a delay line having frequency characteristics (gain and phase characteristics) and delay characteristics similar to those of the main amplifier 13 is inserted on a signal route extending from a first power divider 11 to the first power combiner 25 through a second path 34. In the same fashion, to compensate for frequency characteristics and delay characteristics of the error amplifier 26, a delay line having frequency characteristics and delay characteristics similar to those of the error amplifier 26 is inserted on a signal route extending from a second power divider 14 to the second power combiner 16 through a fourth path 36.

(4) The insertion position of the first vector adjustor 23 is changed to a position on a signal route extending from the first power divider 11 to the second power divider 14 through a first path 33 or a position on a signal route extending from the second power divider 14 to the first power combiner 25 through a third path 35. In this case, an input signal distributed to the second path 34 is supplied intactly to the first power combiner 25. Similarly, the insertion position of the second vector adjustor 19 is changed to a position on a signal route extending from second power divider 14 to the second power divider 16 though the fourth path 36. In this case, an output signal from the error amplifier 26 is supplied intactly to the second power combiner 16.

(5) The insertion position of the third power combiner 22 is changed to an arbitrary position on a signal route extending from the first power divider 11 to the second power divider 14 through the first path 33, e.g., the third power combiner 22 is inserted on the input side of the main amplifier 13.

(6) In each vector adjustor, positions of a variable attenuator 31 and a variable phase shifter 32 are exchanged.

As set forth hereinabove, the present invention provides an improved feedforward amplifier in which a level of the pilot signal is adjusted optimally in each operation of error signal extraction and error signal elimination to increase observation accuracy of each of pilot signal and main signal component levels, thereby enhancing efficiency in distortion suppression on a signal cancel loop while preventing outflow of the pilot signal.

It is further understood by those skilled in the art that the foregoing description is a preferred embodiment of the disclosed device and that various changes and modifications may be made in the invention without departing from the spirit and scope thereof.

What is claimed is:

1. A feedforward amplifier using two kinds of signal cancel loops, comprising:
    an error signal extraction loop including a first power divider for distributing an input signal to a first path and a second path, a main amplifier for amplifying the input signal distributed to said first path, a second power divider for distributing an output signal from said main amplifier to a third path and a fourth path, a first vector adjustor for adjusting attenuation and phase shift levels for the input signal distributed to said second path, a first power combiner for adding the output signal distributed to said third path and an output signal from said first vector adjustor, an error amplifier for amplifying an output signal from said first power combiner, first level observation means for detecting a level of an output signal from said error amplifier, first control means for controlling attenuation and phase shift levels of said first vector adjustor so that a detection level of said first level observation means is minimized, a pilot signal oscillator for generating a pilot signal having a particular frequency, and a third power combiner for supplying the pilot signal generated by said pilot signal oscillator to an arbitrary point on a signal route extending from said first power divider to said second power divider; and
    an error signal elimination loop including a second vector adjustor for adjusting attenuation and phase shift levels for the output signal from said error amplifier, a second power combiner for adding the output signal distributed to said fourth path and an output signal from said second vector adjustor, second level observation means for detecting a level of the pilot signal contained in an output signal from said second power combiner, and second control means for controlling attenuation and phase levels of said second vector adjustor so that a detection level of said second level observation means is minimized;
    wherein a switch is disposed between said pilot signal oscillator and said third power combiner, and third control means for controlling the opening/closing of said switch is provided so that the pilot signal is stopped when said first control means performs control operation of attenuation and phase shift levels of said first vector adjustor and that the pilot signal is supplied when said second control means performs control operation of attenuation and phase shift levels of said second vector adjustor.

2. A feedforward amplifier according to claim 1, wherein a delay line having frequency characteristics and delay characteristics similar to those of said main amplifier is connected on a signal route extending from said first power divider to said first power combiner through said second path.

3. A feedforward amplifier according to claim 2, wherein said first level observation means serves to detect a level of an output signal from said first power combiner instead of detecting a level of an output signal from said error amplifier.

4. A feedforward amplifier according to claim 2, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

5. A feedforward amplifier according to claim 1, wherein a delay line having frequency characteristics and delay characteristics similar to those of said error amplifier is connected on a signal route extending from said second power divider to said second power combiner through said fourth path.

6. A feedforward amplifier according to claim 5, wherein said first level observation means serves to detect a level of an output signal from said first power combiner instead of detecting a level of an output signal from said error amplifier.

7. A feedforward amplifier according to claim 5, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

8. A feedforward amplifier according to claim 1, wherein said first vector adjustor and said second power divider are connected in an arrangement that said first vector adjustor is disposed on a signal route extending from said second power divider to said first power combiner through said third path, and wherein said first power combiner performs addition on an output signal from said first vector adjustor and an input signal distributed to said second path.

9. A feedforward amplifier according to claim 8, wherein said first level observation means serves to detect a level of an output signal from said first power combiner instead of detecting a level of an output signal from said error amplifier.

10. A feedforward amplifier according to claim 8, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

11. A feedforward amplifier according to claim 1, wherein said first vector adjustor and said second power divider are connected in an arrangement that said first vector adjustor is disposed on a signal route extending from said first power divider to said second power divider through said first path, and wherein said first power combiner performs addition on an output signal distributed to said third path and an input signal distributed to said second path.

12. A feedforward amplifier according to claim 11, wherein said first level observation means serves to detect a level of an output signal from said first power combiner instead of detecting a level of an output signal from said error amplifier.

13. A feedforward amplifier according to claim 11, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

14. A feedforward amplifier according to claim 1, wherein said second vector adjustor and said second power combiner are connected in an arrangement that said second vector adjustor is disposed on a signal path extending from said second power divider to said second power combiner through said fourth path, and wherein said second power combiner performs addition on an output signal from said second vector adjustor and an output signal from said error amplifier.

15. A feedforward amplifier according to claim 14, wherein said first level observation means serves to detect a level of an output signal from said first power combiner instead of detecting a level of an output signal from said error amplifier.

16. A feedforward amplifier according to claim 14, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

17. A feedforward amplifier according to claim 1, wherein a variable attenuator is provided in place of said switch and said third control means controls said variable attenuator in a manner that an increased attenuation level thereof corresponds to an open state of said switch and a decreased attenuation level thereof corresponds to a closed state of said switch.

18. A feedforward amplifier according to claim 17, wherein said first level observation means serves to detect a level of an output signal from said first power combiner instead of detecting a level of an output signal from said error amplifier.

19. A feedforward amplifier according to claim 17, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

20. A feedforward amplifier according to claim 1, wherein said first level observation means serves to detect a level of an output signal from said first power combiner instead of detecting a level of an output signal from said error amplifier.

21. A feedforward amplifier according to claim 20, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

22. A feedforward amplifier according to claim 1, wherein said second level observation means comprises a local oscillator, a mixer which receives a carrier signal generated by said local oscillator and an output signal from said second power combiner and outputs a difference frequency component between these signals, a low-pass filter for passing a low-frequency component of output from said mixer, an amplifier circuit for amplifying output from said low-pass filter, and an envelope demodulator circuit for detecting an envelope of output from said amplifier circuit.

* * * * *